(12) United States Patent
Fan

(10) Patent No.: US 8,292,380 B2
(45) Date of Patent: Oct. 23, 2012

(54) RACK FOR CABINET

(75) Inventor: Chen-Lu Fan, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/956,628

(22) Filed: Nov. 30, 2010

(65) Prior Publication Data

US 2012/0007485 A1    Jan. 12, 2012

(30) Foreign Application Priority Data

Jul. 9, 2010   (CN) .......................... 2010 1 0223019

(51) Int. Cl.
*A47G 29/00*    (2006.01)
*F16B 7/04*    (2006.01)
(52) U.S. Cl. ..................................... 312/265.4; 403/217
(58) Field of Classification Search .................... 211/26, 211/189, 182; 403/205, 217, 231, 171, 172; 52/280, 655.1; 174/50, 100, 101; 312/265.1–265.4, 312/223.1, 100, 102
See application file for complete search history.

(56) References Cited

U.S. PATENT DOCUMENTS

| | | | | | |
|---|---|---|---|---|---|
| 288,126 | A | * | 11/1883 | Shearman | 248/188 |
| 1,398,695 | A | * | 11/1921 | Hull | 52/286 |
| 2,058,263 | A | * | 10/1936 | Rosendale | 312/265.4 |
| 2,208,227 | A | * | 7/1940 | Page | 52/280 |
| 2,470,403 | A | * | 5/1949 | Klomparens | 403/172 |
| 3,143,165 | A | * | 8/1964 | Lewis et al. | 160/394 |
| 3,305,255 | A | * | 2/1967 | Henderson | 403/219 |
| 3,307,894 | A | * | 3/1967 | Collier | 312/265.2 |
| 3,545,625 | A | * | 12/1970 | MacMillan | 211/189 |
| 3,559,357 | A | * | 2/1971 | Lowe | 52/282.4 |
| 3,681,888 | A | * | 8/1972 | Kim | 52/836 |
| 3,765,541 | A | * | 10/1973 | Madey et al. | 211/182 |
| 3,784,043 | A | * | 1/1974 | Presnick | 220/4.28 |
| 3,835,354 | A | * | 9/1974 | Torres-Pena | 312/265.4 |

(Continued)

FOREIGN PATENT DOCUMENTS

DE        3530548 A1 *    3/1987

OTHER PUBLICATIONS

Machine Translation "Description DE 3530548", Published Mar. 12, 1987.*

*Primary Examiner* — Teri P. Luu
*Assistant Examiner* — Kimberley S Wright
(74) *Attorney, Agent, or Firm* — Altis Law Group, Inc.

(57) ABSTRACT

A rack includes a upper frame, a frame post, and a confluence member. The upper frame includes a first pillar and a second pillar connected to the first pillar. A first guiding groove is defined in the first pillar. A second guiding groove is defined in the second pillar. The first guiding groove and the second guiding groove extend substantially along the horizontal plane. The frame post is coupled with a connection portion of the first pillar and the second pillar. A third guiding groove is defined in the frame post. The third guiding groove extends uprightly. The confluence member is mounted between the frame post and the connection portion of the first pillar and the second pillar. A plurality of confluence grooves is defined in the confluence member. The plurality of confluence grooves links the first guiding groove and the second guiding groove to the third guiding groove.

18 Claims, 4 Drawing Sheets

U.S. PATENT DOCUMENTS

| | | | | |
|---|---|---|---|---|
| 3,955,702 | A * | 5/1976 | Lundy | 220/4.28 |
| 4,066,370 | A * | 1/1978 | Van Driessche | 403/217 |
| 4,078,847 | A * | 3/1978 | Presnick | 312/140 |
| 4,114,336 | A * | 9/1978 | Bechet et al. | 52/280 |
| 4,126,364 | A * | 11/1978 | Reilly | 312/140 |
| 4,205,486 | A * | 6/1980 | Guarnacci | 49/501 |
| 4,291,928 | A * | 9/1981 | Kiyosawa | 312/140 |
| 4,413,570 | A * | 11/1983 | Haigh | 108/158.13 |
| 4,455,102 | A * | 6/1984 | Baroi et al. | 403/173 |
| 4,493,425 | A * | 1/1985 | Yoshida | 211/189 |
| 4,545,490 | A * | 10/1985 | Hsiao et al. | 211/191 |
| 4,584,801 | A * | 4/1986 | Weinberger | 52/64 |
| 4,610,561 | A * | 9/1986 | Cecchellero et al. | 403/171 |
| 4,626,124 | A * | 12/1986 | Laroche | 403/295 |
| 4,691,970 | A * | 9/1987 | Neri | 312/265.5 |
| 4,726,701 | A * | 2/1988 | Thomas | 403/172 |
| 4,758,111 | A * | 7/1988 | Vitta | 403/176 |
| 4,782,637 | A * | 11/1988 | Eriksson et al. | 52/280 |
| 4,837,997 | A * | 6/1989 | Zeilinger | 52/280 |
| 4,941,717 | A * | 7/1990 | Beaulieu | 312/265.3 |
| 4,954,007 | A * | 9/1990 | Pinney | 403/172 |
| 4,997,240 | A * | 3/1991 | Schmalzl et al. | 312/265.4 |
| 4,998,636 | A * | 3/1991 | Hardigg | 220/4.34 |
| 5,020,866 | A * | 6/1991 | McIlwraith | 312/265.4 |
| 5,046,791 | A * | 9/1991 | Kooiman | 312/265.1 |
| 5,066,161 | A * | 11/1991 | Pinney | 403/172 |
| 5,228,762 | A * | 7/1993 | Mascrier | 312/265.4 |
| RE34,393 | E * | 9/1993 | McIlwraith | 312/265.4 |
| 5,298,681 | A * | 3/1994 | Swift et al. | 174/97 |
| 5,305,571 | A * | 4/1994 | Trevino | 52/653.2 |
| D357,175 | S * | 4/1995 | Godfrey | D8/382 |
| 5,423,604 | A * | 6/1995 | Chern | 312/265.1 |
| 5,469,678 | A * | 11/1995 | Zamerovsky | 52/263 |
| 5,481,842 | A * | 1/1996 | Gautreau | 52/656.9 |
| 5,546,718 | A * | 8/1996 | Way | 52/238.1 |
| 5,625,987 | A * | 5/1997 | Zamerovsky | 52/263 |
| 5,647,181 | A * | 7/1997 | Hunts | 52/282.1 |
| 5,695,263 | A * | 12/1997 | Simon et al. | 312/265.4 |
| 5,772,296 | A * | 6/1998 | Hartel et al. | 312/265.1 |
| 5,848,500 | A * | 12/1998 | Kirk | 52/79.1 |
| 5,873,480 | A * | 2/1999 | Wells, Jr. | 220/4.02 |
| 5,918,998 | A * | 7/1999 | Pourmand | 403/218 |
| 5,997,117 | A * | 12/1999 | Krietzman | 312/265.4 |
| 6,062,664 | A * | 5/2000 | Benner | 312/265.1 |
| 6,102,498 | A * | 8/2000 | Kohler et al. | 312/223.1 |
| 6,123,400 | A * | 9/2000 | Nicolai et al. | 312/265.1 |
| 6,141,927 | A * | 11/2000 | Usui | 52/263 |
| 6,149,255 | A * | 11/2000 | Benner et al. | 312/265.4 |
| 6,192,636 | B1 * | 2/2001 | Hayashi et al. | 52/126.7 |
| 6,223,917 | B1 * | 5/2001 | Bruder | 211/189 |
| 6,231,142 | B1 * | 5/2001 | Pochet | 312/265.3 |
| 6,270,283 | B1 * | 8/2001 | Turati | 403/217 |
| 6,315,132 | B1 * | 11/2001 | Hartel et al. | 211/26 |
| 6,332,657 | B1 * | 12/2001 | Fischer | 312/111 |
| 6,379,074 | B1 * | 4/2002 | Chin et al. | 403/231 |
| 6,428,127 | B1 * | 8/2002 | Rasmussen | 312/265.4 |
| 6,478,501 | B1 * | 11/2002 | Kahl | 403/255 |
| 6,516,955 | B1 * | 2/2003 | Dudhwala et al. | 211/26 |
| 6,634,512 | B2 * | 10/2003 | Knab et al. | 211/189 |
| 6,811,231 | B1 * | 11/2004 | Fontana et al. | 312/265.1 |
| 6,974,036 | B2 * | 12/2005 | Wyatt et al. | 211/26 |
| 8,028,480 | B2 * | 10/2011 | Loeks | 52/233 |
| 8,152,403 | B2 * | 4/2012 | Shen | 211/189 |
| 2004/0036389 | A1 * | 2/2004 | Tsai | 312/265.4 |
| 2006/0288656 | A1 * | 12/2006 | Clarke | 52/233 |
| 2008/0218042 | A1 * | 9/2008 | Hartel et al. | 312/265.4 |
| 2009/0001863 | A1 * | 1/2009 | Wyatt et al. | 312/265.3 |
| 2011/0309046 | A1 * | 12/2011 | Lee | 211/182 |
| 2012/0012543 | A1 * | 1/2012 | Fan | 211/26 |

* cited by examiner

RACK FOR CABINET

BACKGROUND

1. Technical Field

The present disclosure relates to racks, and particularly to a rack for a waterproof cabinet.

2. Description of Related Art

Cabinets are widely used to receive different electronic apparatuses therein, for those electronic apparatuses which are located outdoor; the cabinets often define a number of vent holes thereon to dissipate heat, which is generated by the electronic apparatuses. However, it is easy for rainwater to flow into the cabinets through the vent holes, which can damage the electronic apparatuses mounted therein. For protecting the electronic apparatuses, additional apparatus are added for water-proofing. For example, a water-proofing canopy is mounted above the cabinet to protect the electronic apparatuses. However, the water-proofing canopy adds additional cost.

Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
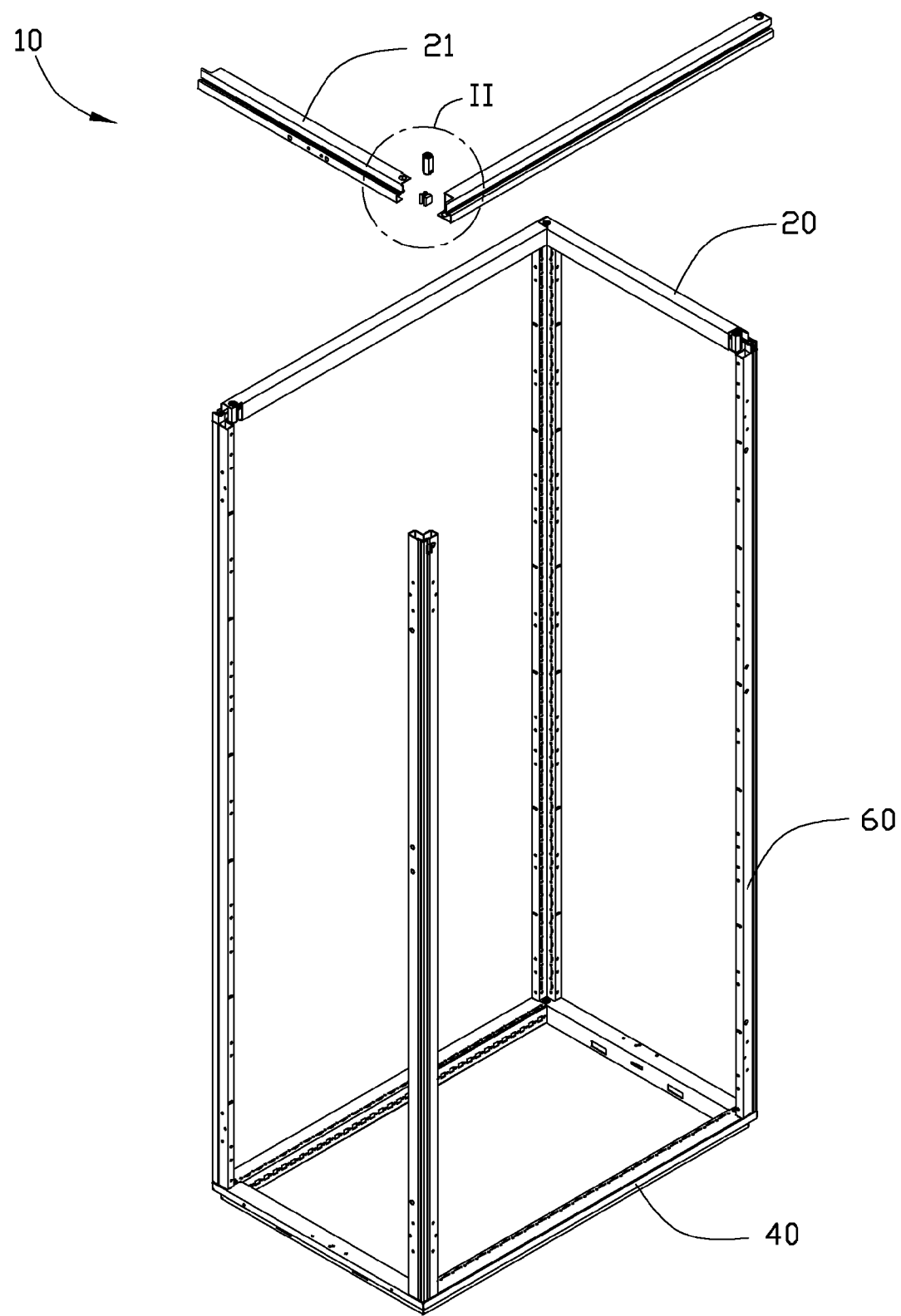
FIG. 1 is an isometric and exploded view of a rack for a cabinet in accordance with one embodiment.
Figure 2:
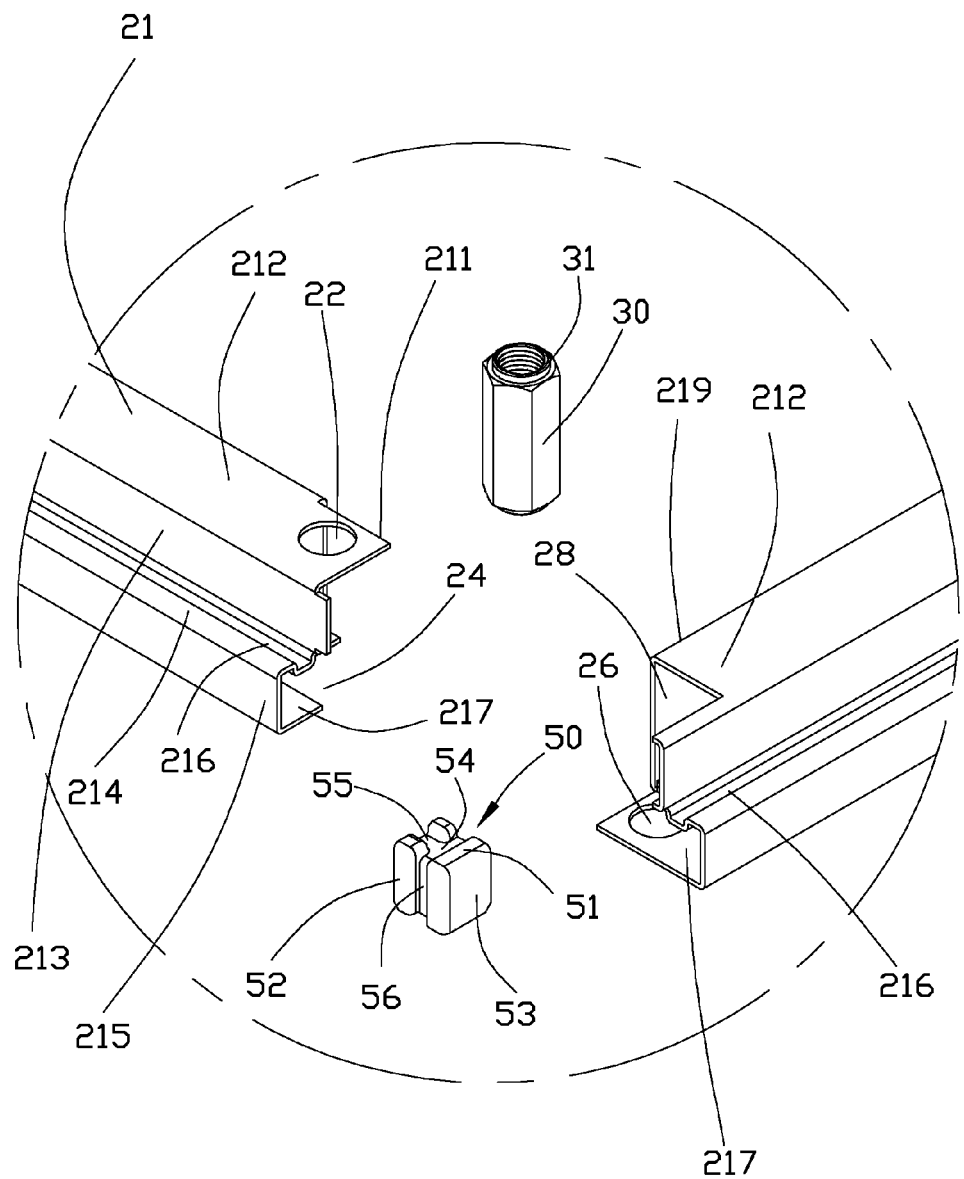
FIG. 2 is an enlarged view of an encircled portion II of FIG. 1.

Referring to FIGS. 1 and 2, a rack 10 for a cabinet includes a upper frame 20, a lower frame 40, and four vertical frame posts 60 for connecting the upper frame 20 and the lower frame 40. The upper frame 20 includes four pillars 21. The four pillars 21 connect to each other end to end to form the upper frame 20.

A sectional view of the pillar 21 has a stepped appearance. The pillar 21 includes a first top wall 212, a first side wall 213, a second top wall 214, a second side wall 215, and a bottom wall 217. The first top wall 212 extends in a horizontal direction. An edge of the top wall 212 extends downwards and perpendicularly to form the first side wall 213. A bottom edge of the first side wall 213 extends horizontally and perpendicularly to form the second top wall 214. An edge of the second top wall 214 extends downwards and perpendicularly to form the second side wall 215. A bottom edge of the second side wall 215 extends horizontally and perpendicularly to form the bottom wall 217. A portion of the second top wall 214 is punched downward to form a first guiding groove 216 which extends in a horizontal direction. It is understood that the guiding grooves can have a slight slope to direct fluid to flow in the desired direction(s).

Each pillar 21 includes a first end 211 and a second end 219. FIG. 2 shows a first end 211 of a first pillar of the four pillars 21 and a second end 219 of a second pillar of the four pillars 21. On the first end 211, the first top wall 212 defines a first securing hole 22, and the bottom wall 217 defines a first cutout 24 in alignment with the first securing hole 22. On the second end 219, the bottom wall 217 defines a second securing hole 26, and the first top wall 212 defines a second cutout 28 in alignment with the second securing hole 26.

A connection member 30 is configured to connected to two pillars 21 together. Each of a top end and a bottom end of the connection member 30 forms a securing portion 31 thereon.

Figure 4:
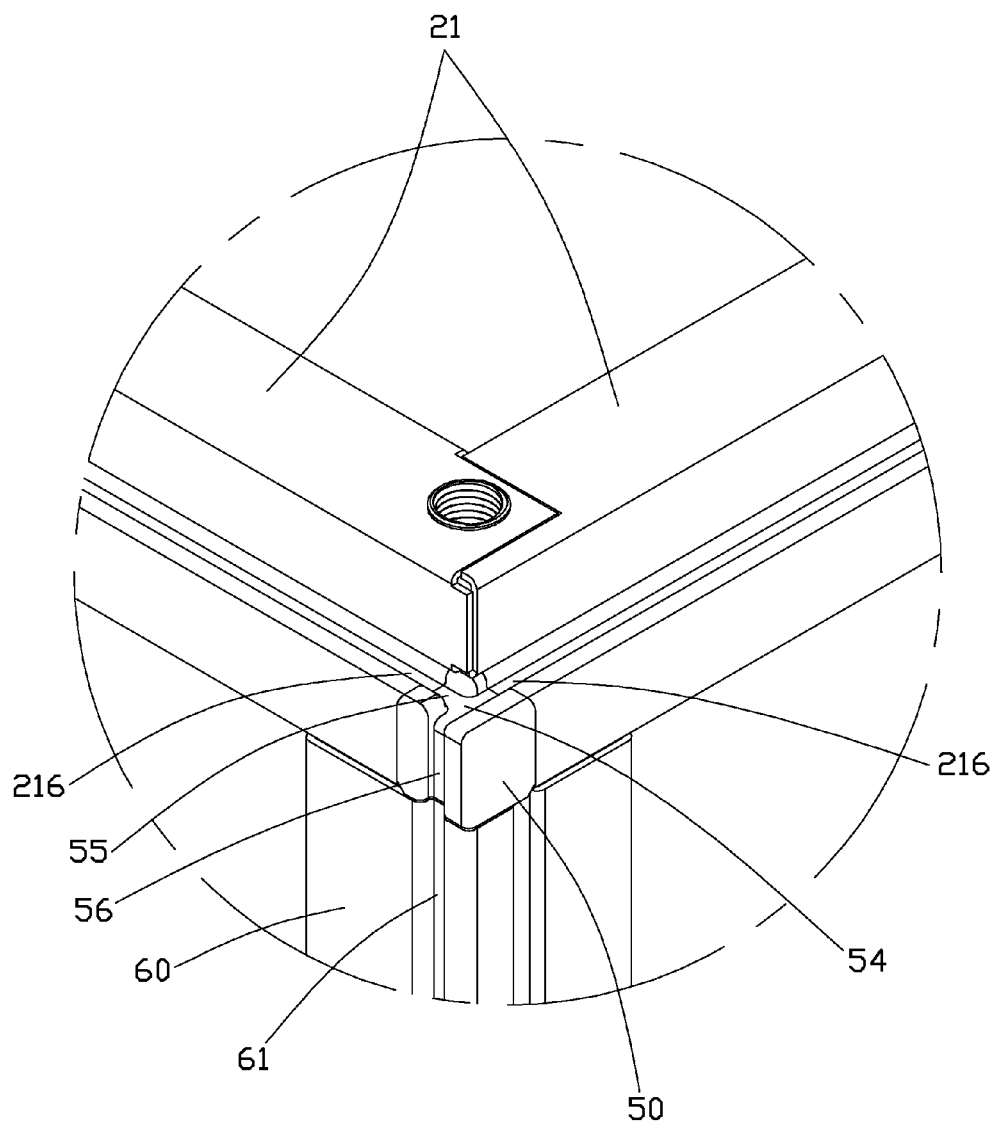
FIG. 4 is an enlarged view of an encircled portion IV of FIG. 3.

A middle portion of each frame post 60 forms a second guiding groove 61 (see FIG. 4). The second guiding groove 61 extends in a vertical direction.

Referring to FIG. 2, a confluence member 50 is configured to be mounted between two adjacent pillars 21. The confluence member 50 includes a top surface 51, a first side surface 52, a second side surface 53. The top surface 51, the first side surface 52, and the second side surface 53 are perpendicularly connected to each other. The top surface 51 defines a first confluence groove 54 and a second confluence groove 55 perpendicular to the first confluence groove 54. Both of the first confluence groove 54 and the second confluence groove 55 extends in the horizontal direction. The first side surface 52 defines a third confluence groove 56 which extends in the vertical direction. The first confluence groove 54 and the third confluence groove 56 communicate with each other, and together forms an "L" shape groove. The second confluence groove 55 communicates with a middle portion of the first confluence groove 54. The first confluence groove 54 and the second confluence groove 55 together form a "T" shape groove.

Figure 3:
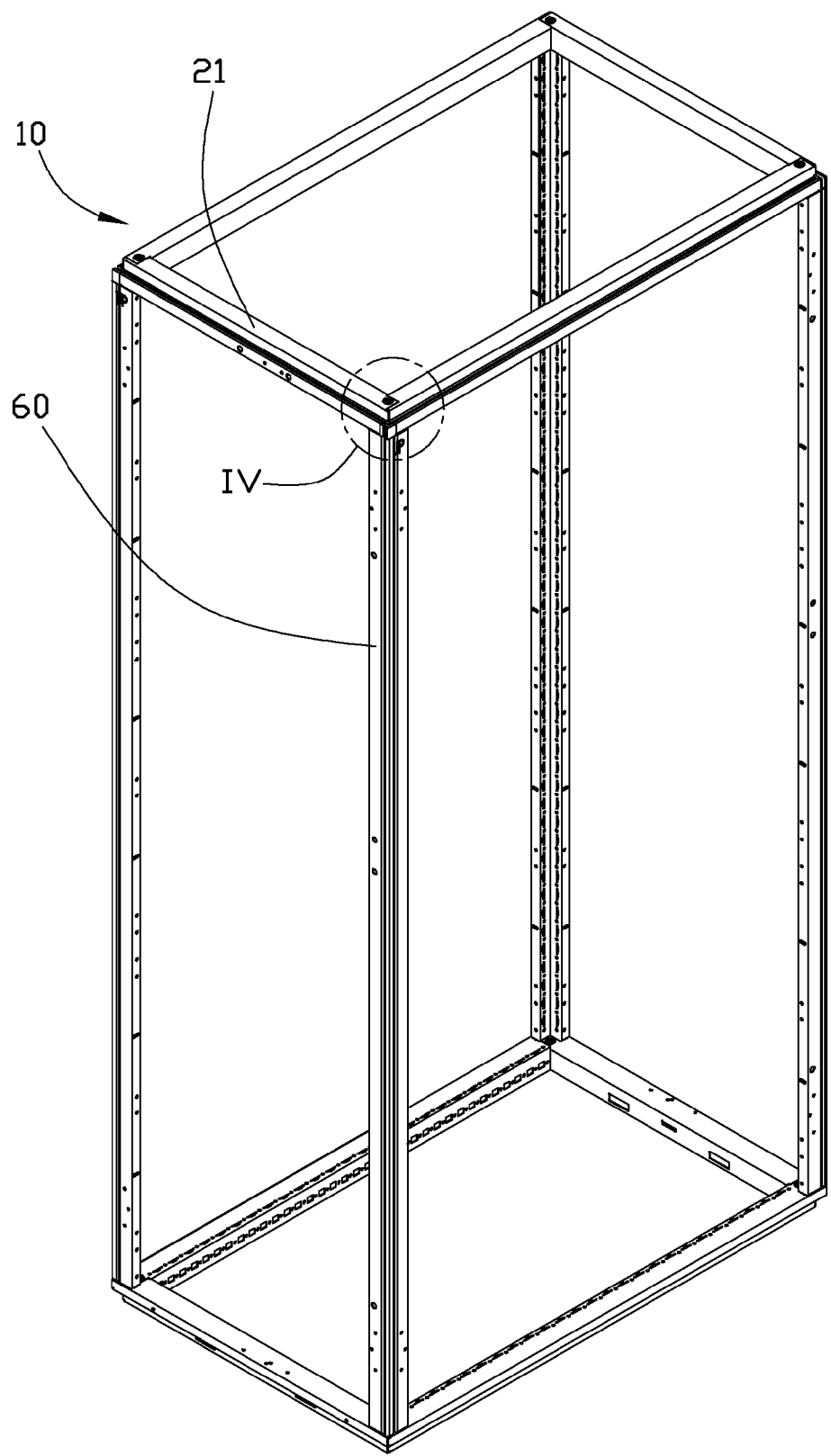
FIG. 3 is an assembly view of the rack of FIG. 1.

Referring to FIGS. 2 to 4, in assembly of the rack 10, two pillars 21 are perpendicularly aligned with each other with a first end 211 of one of two pillars 21 adjacent to a second end 219 of another one of the two pillars 21. The first securing hole 22 of the first end 211 is received in the second cutout 28 of the second end 219. The second securing hole 26 of the second end 219 is received in the first cutout 24 of the first end 211. Then, a first side of the confluence member 50 is coupled with the first end 211 in a conventional manner, such as soldering, to communicate the second confluence groove 55 with the first guiding groove 216 of the first end 211. A second side of the confluence member 50 is coupled with the second end 219 in a conventional manner, such as soldering, to communicate the first confluence groove 54 with the first guiding groove 216 of the second end 219. The two securing portions 31 of the connection member 30 are secured in the first securing hole 22 of the first end 211 and the second securing hole 26 of the second end 219 to secure the two pillars 21 together. Therefore, four pillars 21 are connected in the above manner to form the upper frame 20.

At last, four frame posts 60 are placed in four corners of the upper frame 20, and each of the four frame posts 60 are secured to adjacent two pillars 21 in a conventional manner, such as soldering. The second guiding groove 61 of the frame post 60 is in alignment with the third confluence groove 56 of corresponding confluence member 50. Therefore, water on the upper portion of the rack 10 can be guided by the first guiding groove 216, the first confluence groove 54, the second confluence groove 55, the third confluence groove 56, and the second guiding groove 61 to allow water to flow down from the rack 10.

In the rack, the first guiding groove 216 is defined by the pillar 21, and the groove 216 is smooth. Water cannot drop from the first guiding groove 216, and can flow in the first guiding groove 216 fluently.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A rack, comprising:
    an upper frame comprising a first pillar and a second pillar secured to the first pillar, a first guiding groove is defined in the first pillar, a second guiding groove is defined in the second pillar, and the first guiding groove and the second guiding groove extend substantially along a horizontal plane;
    a frame post coupled with the first pillar and the second pillar, a third guiding groove is defined in the frame post, the third guiding groove extends uprightly;
    a confluence member mounted between the first pillar and the second pillar, a plurality of confluence grooves is defined in the confluence member; wherein the plurality of confluence grooves links the first guiding groove and the second guiding groove to the third guiding groove; each of the first pillar and the second pillar comprises a first end and a second end opposite to the first end; a first securing hole is defined in a first upper portion of each first end, and a first lower portion of the first end defines a first cutout aligned with the first securing hole; a second securing hole is defined in a second lower portion of the second end, a second upper portion of each second end defines a second cutout aligned with the second securing hole; and the first securing hole of the first pillar is aligned with the second securing hole of the second pillar; and
    a connection member comprises two securing portions, the two securing portions are secured in the first securing hole of the first pillar and the second securing hole of second pillar to connect the first pillar and the second pillar together.

2. The rack of claim 1, wherein the first securing hole is received in the second cutout, and the second securing hole is received in the first cutout.

3. The rack of claim 1, wherein the confluence member comprises a top surface, the plurality of confluence grooves comprises a first confluence groove and a second confluence groove defined in the top surface, the first confluence groove links to the second confluence groove, the first confluence groove links to the first guiding groove of the first pillar, and the second confluence groove links to the second guiding groove of the second pillar.

4. The rack of claim 3, wherein the second confluence groove links to a middle portion of the first confluence groove, and the first confluence groove and the second confluence groove form a "T" like shape.

5. The rack of claim 3, wherein the confluence member comprises a first side surface which is perpendicular to the top surface, a third confluence groove is defined in the first side surface, and third confluence groove links the first confluence groove to the third guiding groove.

6. The rack of claim 5, wherein the third confluence groove is perpendicular to the first confluence groove, and the third confluence groove and the first confluence groove form a "L" like shape.

7. The rack of claim 1, wherein each of the first pillar and the second pillar comprises a first top wall, a first side wall, and a second top wall, the first top wall and the second top wall extend horizontally, the first side wall extends uprightly, the first side wall is located between the first top wall and the second top wall, and the first guiding groove is defined in the second top wall of the first pillar.

8. The rack of claim 7, wherein the first top wall and the second top wall are located on two opposite sides of the first side wall; each of the first pillar and the second pillar further comprises a second side wall and a bottom wall, the second side wall is substantially perpendicularly connected to the second top wall, and the bottom is substantially parallel to the first top wall; the first securing hole is defined in a first end of the first top wall, and the first cutout is defined in a first end of the bottom wall; the second securing hole is defined in a second end of the bottom wall, and the second cutout is defined in a second end of the first top wall.

9. A rack, comprising:
    a first pillar, a first guiding groove defined in the first pillar, the first guiding groove extends substantially along a horizontal plane;
    a frame post coupled with the first pillar, a third guiding groove is defined in the frame post, the third guiding groove extends uprightly;
    a confluence member mounted between the frame post and the first pillar, a plurality of confluence grooves are defined in the confluence member;
    a second pillar secured to the confluence member, the second pillar defines a second guiding groove, and the second guiding groove links to the first guiding grooves;
    wherein each of the plurality of confluence grooves links the first guiding groove to the second guiding groove; each of the first pillar and the second pillar comprises a first end and a second end opposite to the first end; a first securing hole is defined in a first upper portion of the first end, and a first lower portion of the first end defines a first cutout; a second securing hole is defined in a second lower portion of the second end, and a second upper portion of the second end defines a second cutout; the first securing hole of the first pillar is received in the second cutout of the second pillar, and the second securing hole of the second pillar is received in the first cutout of the first pillar; the first pillar has a stepped sectional view, the first pillar comprises a first top wall, a first side wall, and a second top wall, the first top wall and the second top wall extend horizontally, the first side wall extends uprightly, the first side wall is located connected between the first top wall and the second top wall, and the first guiding groove is defined in the second top wall of the first pillar.

10. The rack of claim 9, further comprising a connection member comprising two securing portions, wherein the two securing portions are secured in the first securing hole and the second securing hole to mount the first pillar and the second pillar together.

11. The rack of claim 9, wherein the first securing hole of the first pillar is aligned with the second securing hole of the second pillar.

12. The rack of claim 9, wherein the confluence member comprises a top surface, the plurality of confluence grooves comprises a first confluence groove and a second confluence groove defined in the top surface, the first confluence groove links to the second confluence groove, the first confluence groove further links to the second guiding groove, and the second confluence groove links to the first guiding groove.

13. The rack of claim 12, wherein the second confluence groove links to a middle portion of the first confluence groove, and the first confluence groove and the second confluence groove form a "T" like shape.

14. The rack of claim 12, wherein the confluence member comprises a first side surface perpendicular to the top surface, a third confluence groove is defined in the first side surface, and the third confluence groove links the first confluence groove to the third guiding groove.

15. The rack of claim 14, wherein the third confluence groove is perpendicular to the first confluence groove, and the third confluence groove and the first confluence groove form in an "L" like shape.

16. The rack of claim 9, wherein the first guiding groove is smooth formed in the second top wall of the first pillar.

17. The rack of claim 9, wherein the first top wall and the second top wall are located on two opposite sides of the first side wall.

18. The rack of claim 9, wherein each of the first pillar and the second pillar further comprises a second side wall and a bottom wall, the second side wall is substantially perpendicularly connected to the second top wall, and the bottom wall is substantially parallel to the first top wall; the first securing hole is defined in a first end of the first top wall, and the first cutout is defined in a first end of the bottom wall; the second securing hole is defined in a second end of the bottom wall, and the second cutout is defined in a second end of the first top wall.

* * * * *